(12) United States Patent
Franco et al.

(10) Patent No.: US 8,004,269 B1
(45) Date of Patent: Aug. 23, 2011

(54) WIDE BANDWIDTH MEASUREMENT OF RF POWER INTO AN ARBITRARY IMPEDANCE LOAD

(75) Inventors: Marcelo J. Franco, Summerfield, NC (US); Robert J. Baeten, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 259 days.

(21) Appl. No.: 12/181,755

(22) Filed: Jul. 29, 2008

Related U.S. Application Data

(60) Provisional application No. 60/954,365, filed on Aug. 7, 2007.

(51) Int. Cl.
*G01R 27/02* (2006.01)
*G01R 25/02* (2006.01)
(52) U.S. Cl. .......................................................... 324/95
(58) Field of Classification Search .................. None
See application file for complete search history.

(56) References Cited

U.S. PATENT DOCUMENTS

| | | | | |
|---|---|---|---|---|
| 5,726,566 | A * | 3/1998 | Quist et al. | 324/95 |
| 6,924,698 | B2 * | 8/2005 | Camnitz et al. | 330/140 |
| 7,164,315 | B2 | 1/2007 | Camnitz et al. | |

* cited by examiner

*Primary Examiner* — Paresh Patel
(74) *Attorney, Agent, or Firm* — Withrow & Terranova, P.L.L.C.

(57) ABSTRACT

The present invention relates to a radio frequency (RF) power measurement circuit that measures delivered power to a load. The RF power measurement circuit includes a measurement RF transmission line coupled to the load, and measurement and power calculation circuitry coupled to either end of the measurement RF transmission line to measure an RF input signal feeding the measurement RF transmission line and to measure an RF output signal fed from the measurement RF transmission line to the load. The measurement and power calculation circuitry uses the measured RF input and output signals to calculate and provide a delivered power signal that is indicative of the delivered power to the load.

24 Claims, 13 Drawing Sheets

WIDE BANDWIDTH MEASUREMENT OF RF POWER INTO AN ARBITRARY IMPEDANCE LOAD

This application claims the benefit of provisional patent application Ser. No. 60/954,365, filed Aug. 7, 2007, the disclosure of which is hereby incorporated herein by reference in its entirety.

FIELD OF THE INVENTION

Embodiments of the present invention relate to radio frequency (RF) power measurement circuits, which may be used to measure RF power delivered and received between RF communications circuits.

BACKGROUND OF THE INVENTION

Radio frequency (RF) signals are typically routed between RF circuits in an RF communications system. The integrity of the RF signals may depend on transmission line characteristics, such as impedance, of RF signal paths between the RF circuits. FIG. 1 illustrates a typical RF signal path between two circuits. Specifically, FIG. 1 shows an RF signal source 10 feeding a load 12 through an RF transmission line 14, according to the prior art. The RF signal source 10 provides an RF output signal $RF_{OUT}$ to the RF transmission line 14, which conveys the RF output signal $RF_{OUT}$ along a transmission line length to provide an RF load signal $RF_{LD}$ to the load 12. With perfect impedance matching between an RF signal source output and the RF transmission line 14, and between the RF transmission line 14 and the load 12, power transfer from the RF signal source 10 to the load 12 is maximized without reflections of the RF power.

If there is an impedance mismatch between the RF transmission line 14 and the load 12, some or all of the power may be reflected back toward the RF signal source 10, thereby reducing the quantity of power transferred to the load 12. The power conveyed along the transmission line length toward the load 12 is forward power $P_F$ and the power conveyed along the transmission line length reflected back from the load 12 is reverse power $P_R$. The power delivered to the load 12 is delivered power $P_D$, which is the difference between the forward power $P_F$ and the reverse power $P_R$. Some applications may require measurements of the delivered power $P_D$, the forward power $P_F$, the reverse power $P_R$, or any combination thereof.

FIG. 2 shows an RF power meter 16 coupled between the RF signal source 10 and the load 12 illustrated in FIG. 1. The RF power meter 16 may measure the delivered power $P_D$, the forward power $P_F$, the reverse power $P_R$, or any combination thereof. The RF power meter 16 may be installed temporarily to take power measurements during manufacturing, testing, field service, or the like, or may be installed permanently as part of an RF communications system to take ongoing power measurements. The RF power meter 16 may introduce insertion loss, which reduces efficiency and may impact the accuracy of power measurements. Additionally, the RF power meter 16 may operate over a narrow frequency range and may have narrow impedance requirements for proper operation. Some RF power meters 16 may use directional couplers to differentiate between forward power $P_F$ and reverse power $P_R$; however, directional couplers may be bulky, costly, and have significant insertion losses.

FIG. 3 shows an antenna 18 as the load 12 illustrated in FIG. 2. The RF signal source 10 may be an RF power amplifier, which may provide RF transmit signals to the antenna 18 through the RF power meter 16. Such an arrangement may be used in a portable wireless device, such as a cell phone. In some portable wireless devices, the delivered power $P_D$ to the antenna 18 must be measured and controlled to meet transmit power requirements of a communications standard, specific absorption ratio (SAR) requirements, or the like. Additionally, some portable wireless devices support multiple communications standards using different frequency bands and must operate over a wide range of environmental conditions. The antenna 18 in a portable wireless device is typically subjected to changing RF conditions, such as varying proximity to a user's body, to metallic objects, or the like. Such changing RF conditions may change the impedance of the load 12, thereby affecting power measurements. Thus, there is a need for a small and inexpensive RF power measurement circuit that can accurately measure delivered power $P_D$ over a wide frequency range, with low insertion loss, over a wide range of environmental conditions, into a load 12 having a changing impedance.

SUMMARY OF THE EMBODIMENTS

The present invention relates to a radio frequency (RF) power measurement circuit that measures delivered power to a load. The RF power measurement circuit includes a measurement RF transmission line coupled to the load, and measurement and power calculation circuitry coupled to either end of the measurement RF transmission line to measure an RF input signal feeding the measurement RF transmission line and to measure an RF output signal fed from the measurement RF transmission line to the load. The measurement and power calculation circuitry uses the measured RF input and output signals to calculate and provide a delivered power signal that is indicative of the delivered power to the load.

The relationship between the RF input signal and the RF output signal varies with an electrical length of the measurement RF transmission line. Since the electrical length of the measurement RF transmission line varies with a frequency of the RF input and output signals, the frequency of the RF input and output signals may be determined and used to correct the delivered power signal to be substantially independent of frequency. Therefore, the RF power measurement circuit may accurately measure delivered power over a wide range of frequencies. In one embodiment of the present invention, the RF input and output signals are amplitude modulated (AM) signals traversing a modulation envelope. The measurement and power calculation circuitry may provide at least one delivered power signal based on instantaneous power, average power, instantaneous envelope power, peak envelope power, a ratio of peak envelope power to average power, or any combination thereof.

In some embodiments of the present invention, the RF power measurement circuit may be used as a stand-alone RF power meter, an in-line RF power meter, an integral RF power meter, a temporary RF power meter, an RF power meter used during manufacturing, testing, or servicing, the like, or any combination thereof. In one embodiment of the present invention, the RF power measurement circuit may be used to measure delivered power to an antenna in a communications system, which regulates the delivered power to the antenna to meet transmit power requirements of a particular communications standard, specific absorption ratio (SAR) requirements, or the like.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

Figure 5:
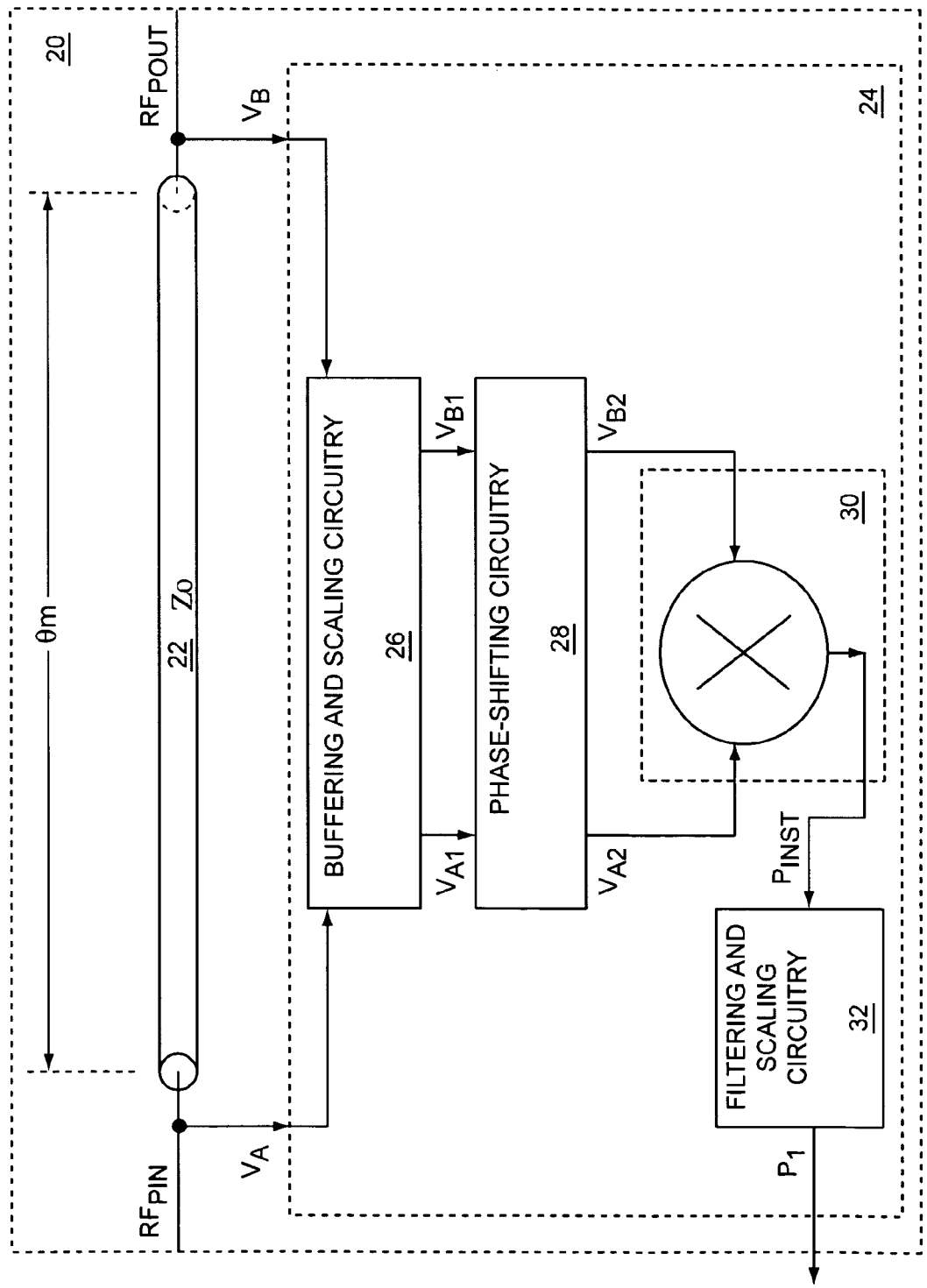
FIG. 5 shows details of measurement and power calculation circuitry illustrated in FIG. 4.
Figure 8A:
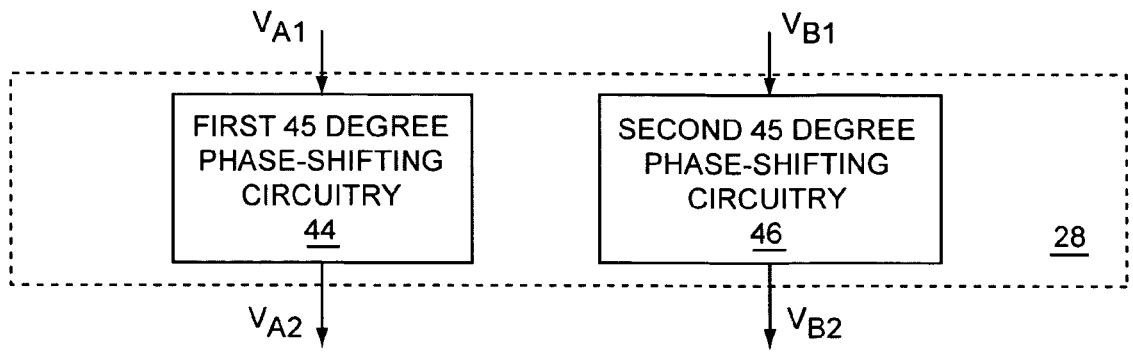
Figure 8B:
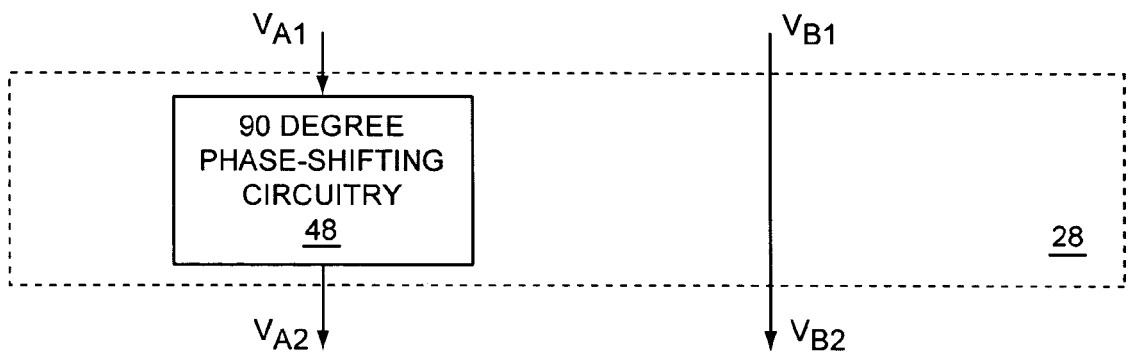
Figure 8C:
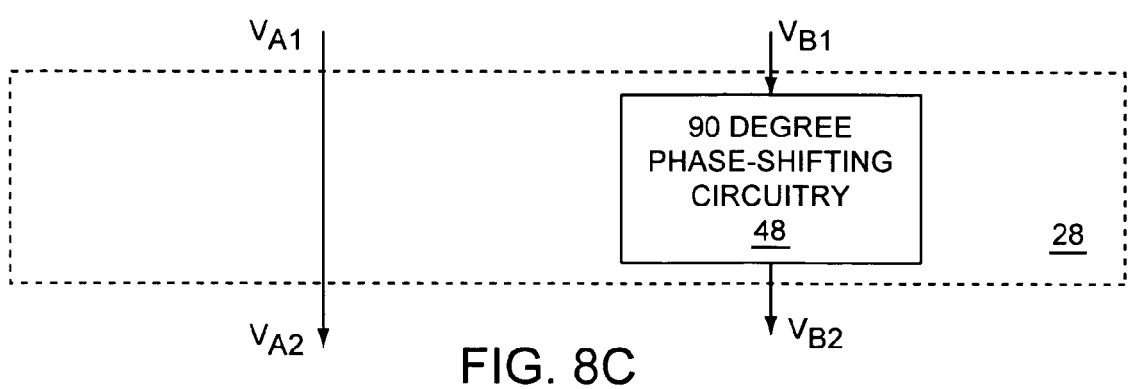

FIGS. 8A, 8B, and 8C show a first embodiment, a second embodiment, and a third embodiment, respectively, of phase-shifting circuitry illustrated in FIG. 5.

Figure 9:
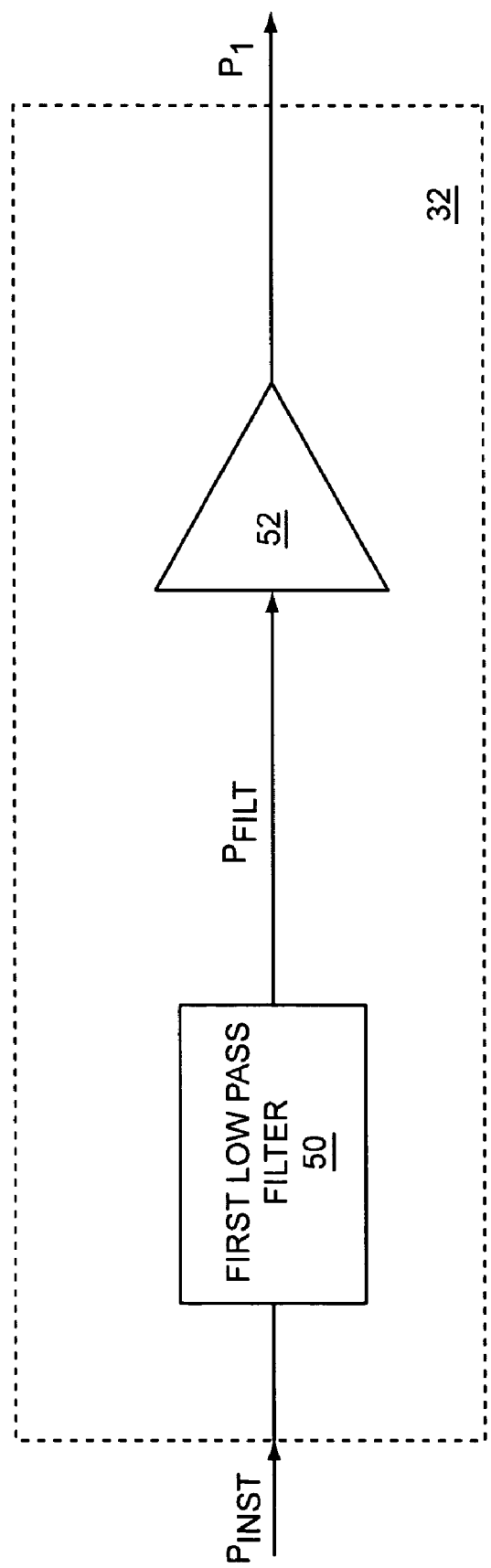

FIG. 9 shows details of a first embodiment of filtering and scaling circuitry illustrated in FIG. 5.

Figure 10:
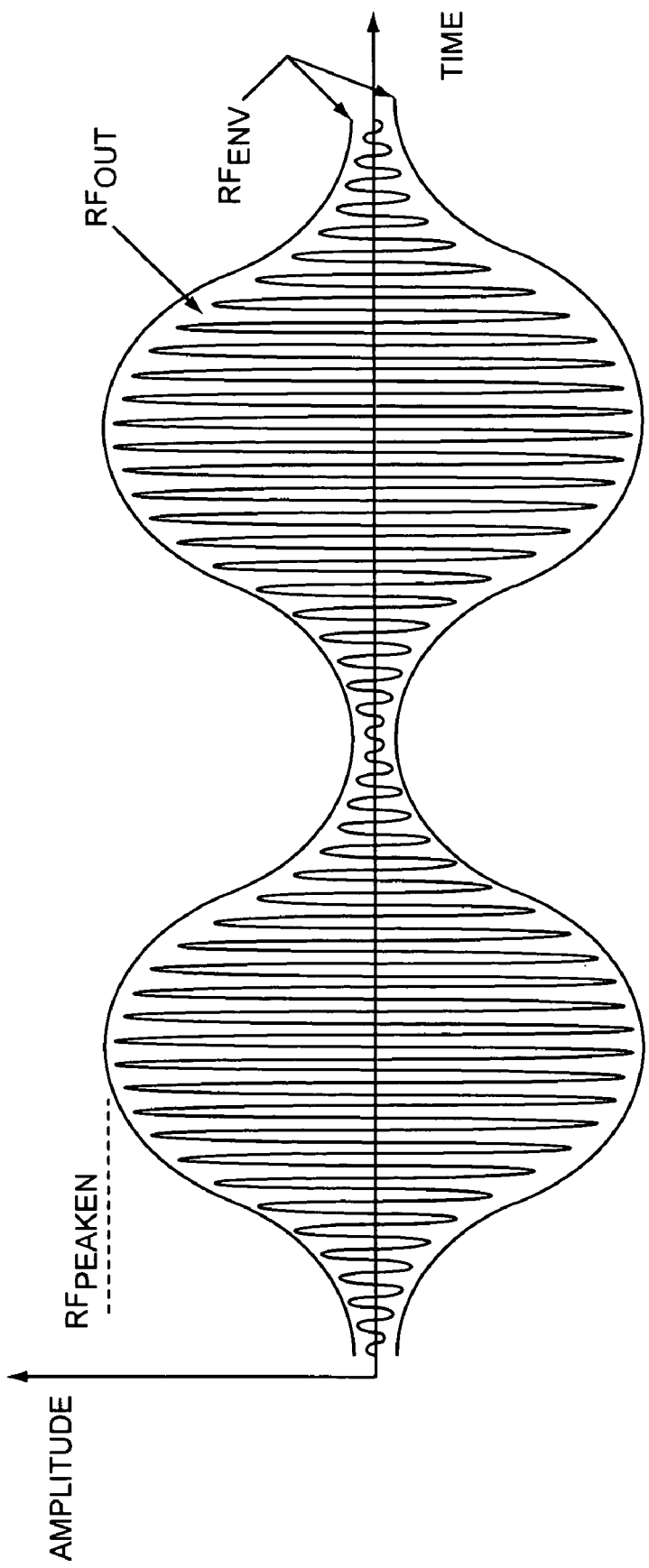

FIG. 10 is a graph illustrating an amplitude modulated (AM) RF output signal, according to a second embodiment of the filtering and scaling circuitry.

Figure 1:
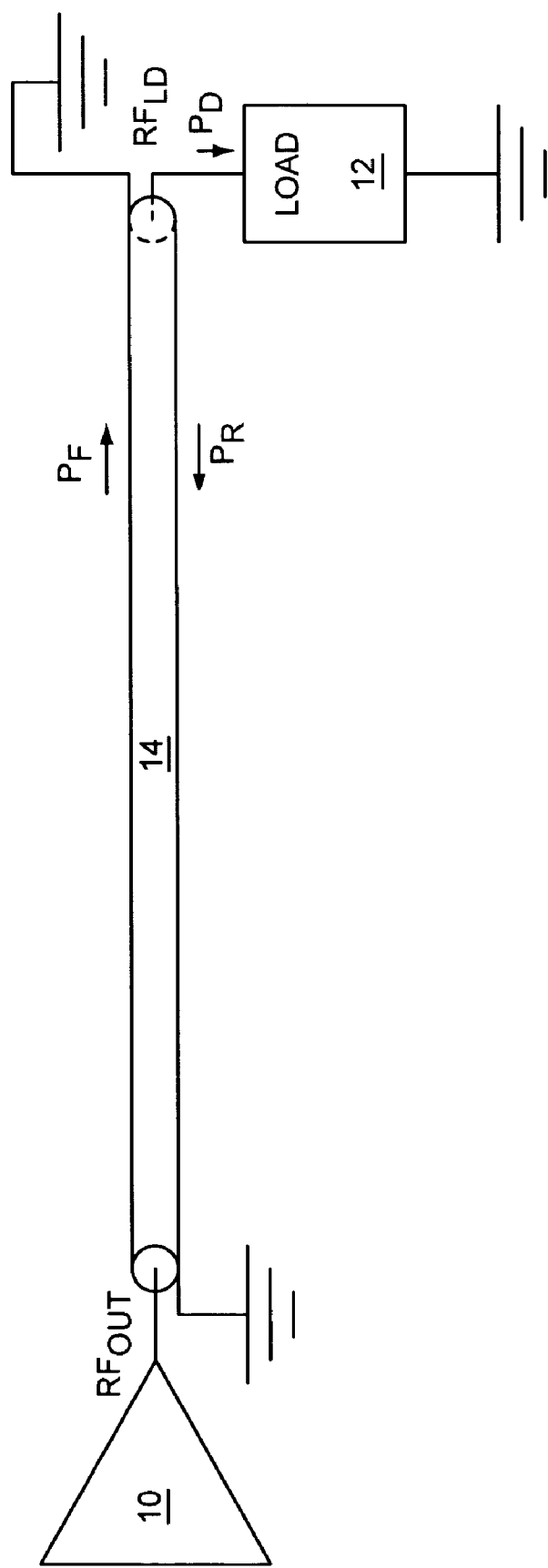
FIG. 1 shows a radio frequency (RF) signal source feeding a load through an RF transmission line, according to the prior art.
Figure 2:
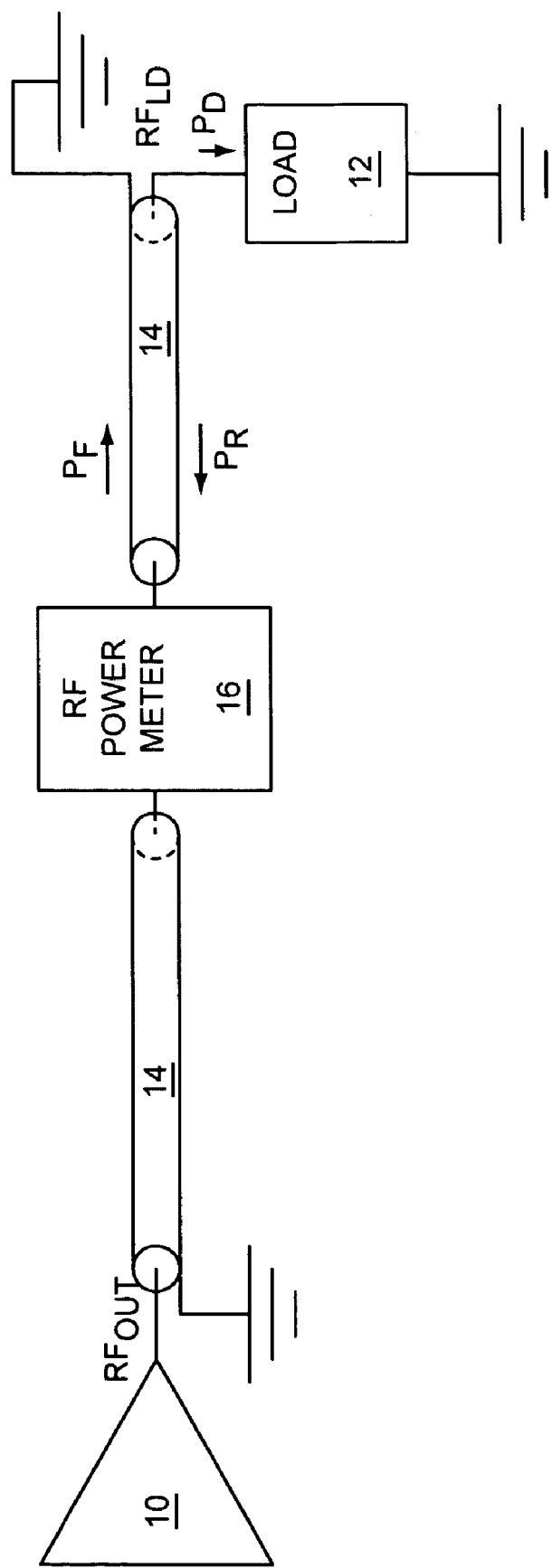
FIG. 2 shows an RF power meter coupled between the RF signal source and the load illustrated in FIG. 1.
Figure 3:
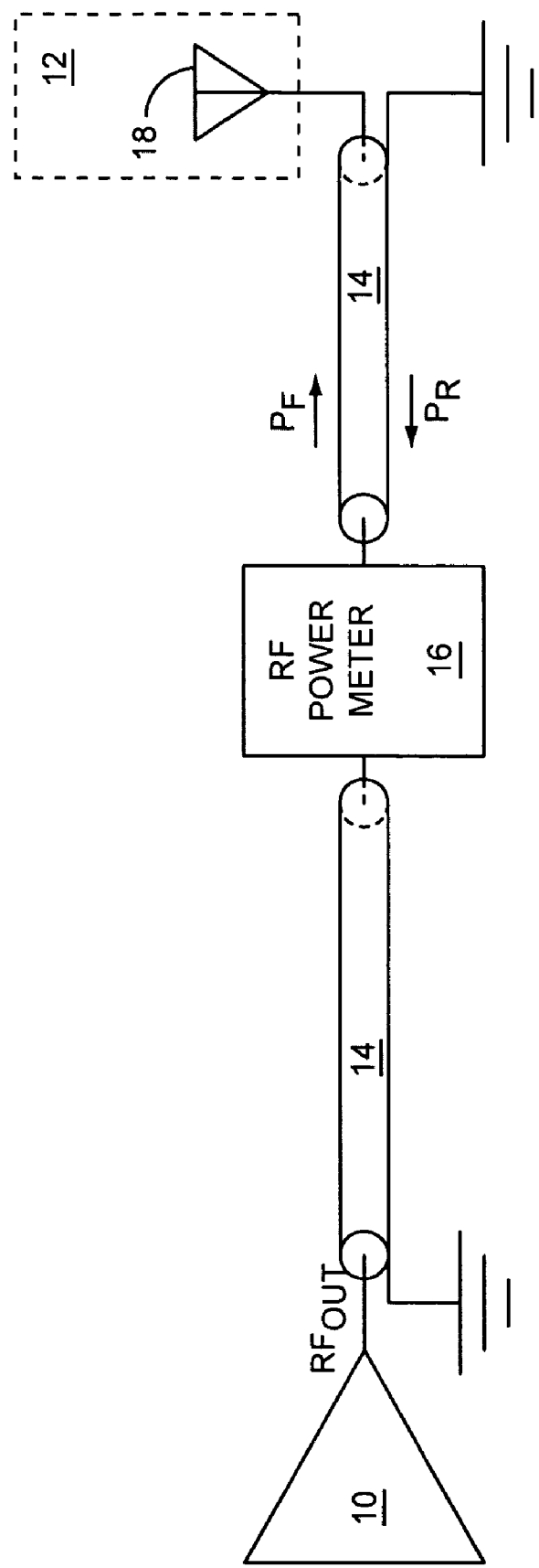
FIG. 3 shows an antenna as the load illustrated in FIG. 2.
Figure 4:
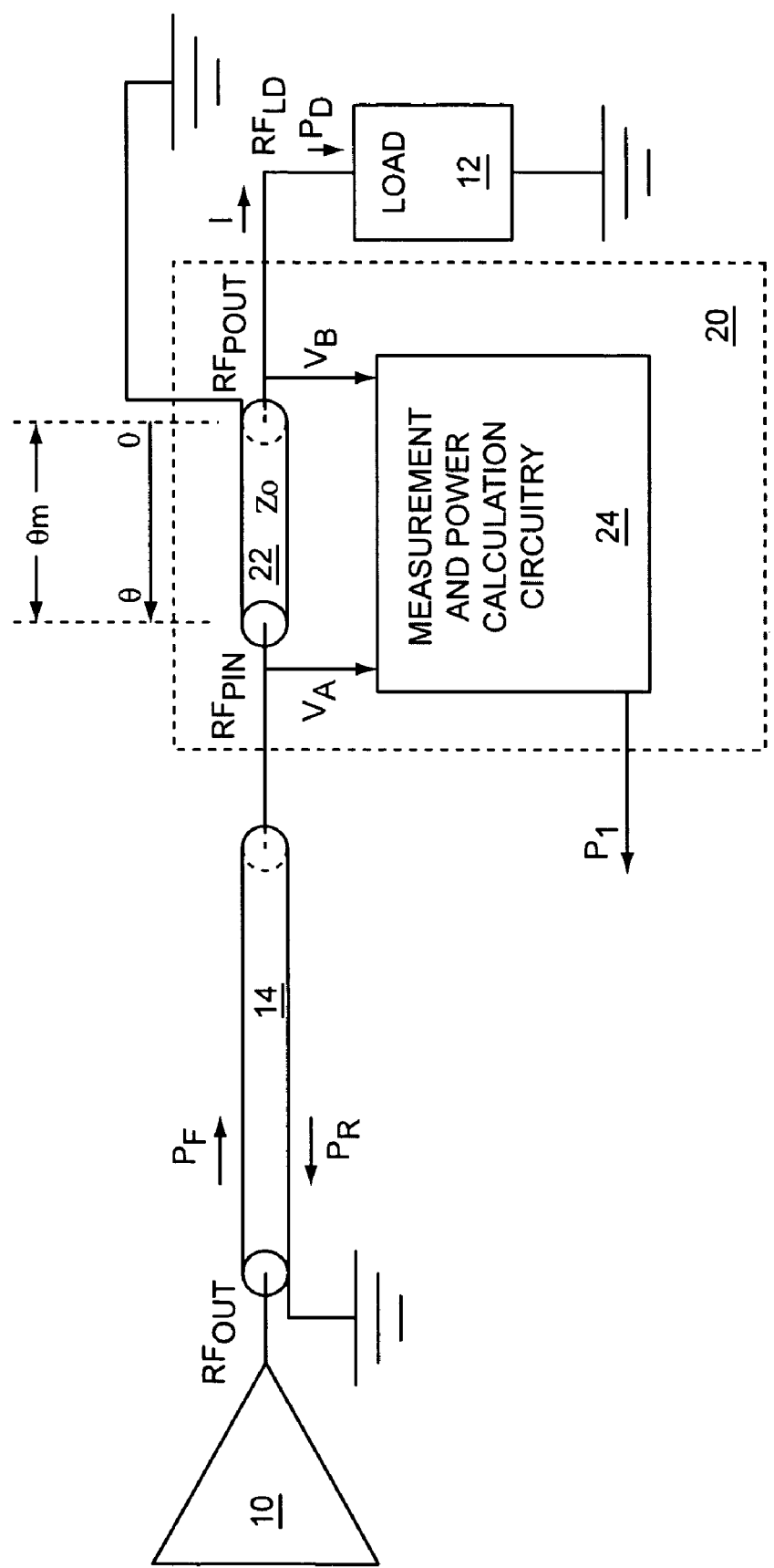
FIG. 4 shows an RF power measurement circuit coupled between the RF signal source and the load, according to one embodiment of the present invention.
Figure 11:
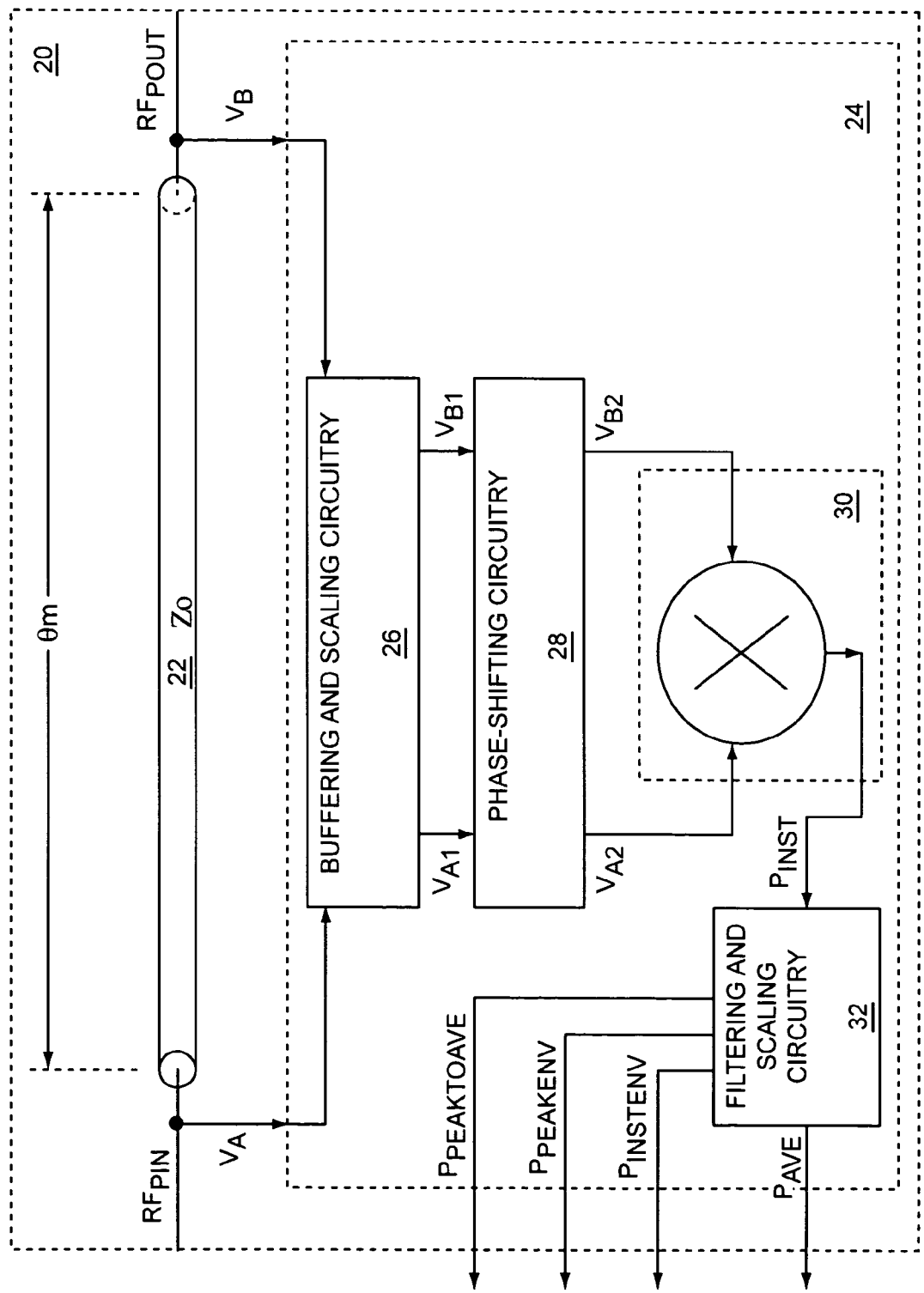

FIG. 11 shows details of the measurement and power calculation circuitry illustrated in FIG. 4, according to the second embodiment of the filtering and scaling circuitry.

Figure 12:
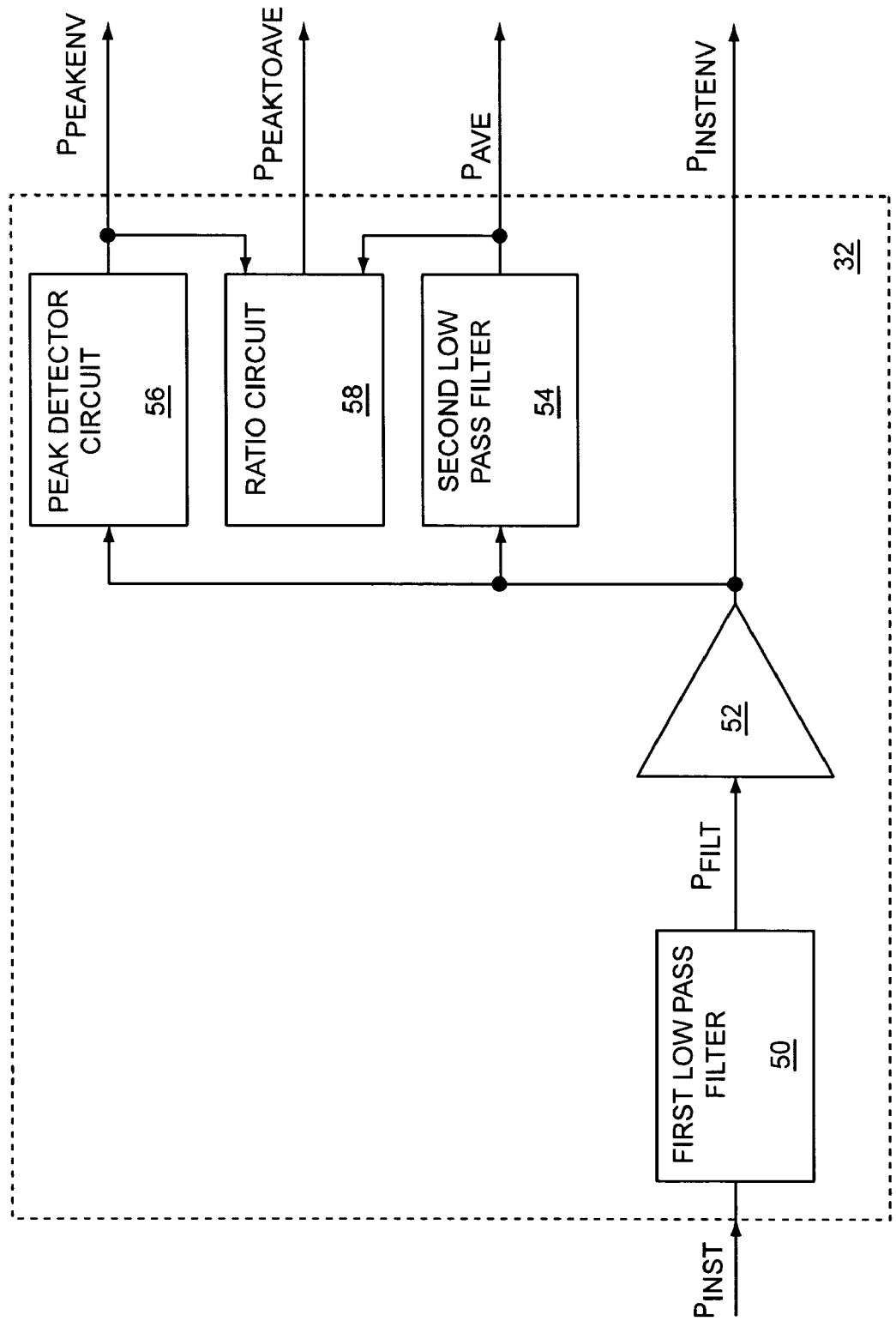

FIG. 12 shows details of the second embodiment of the filtering and scaling circuitry illustrated in FIG. 11.

Figure 13:
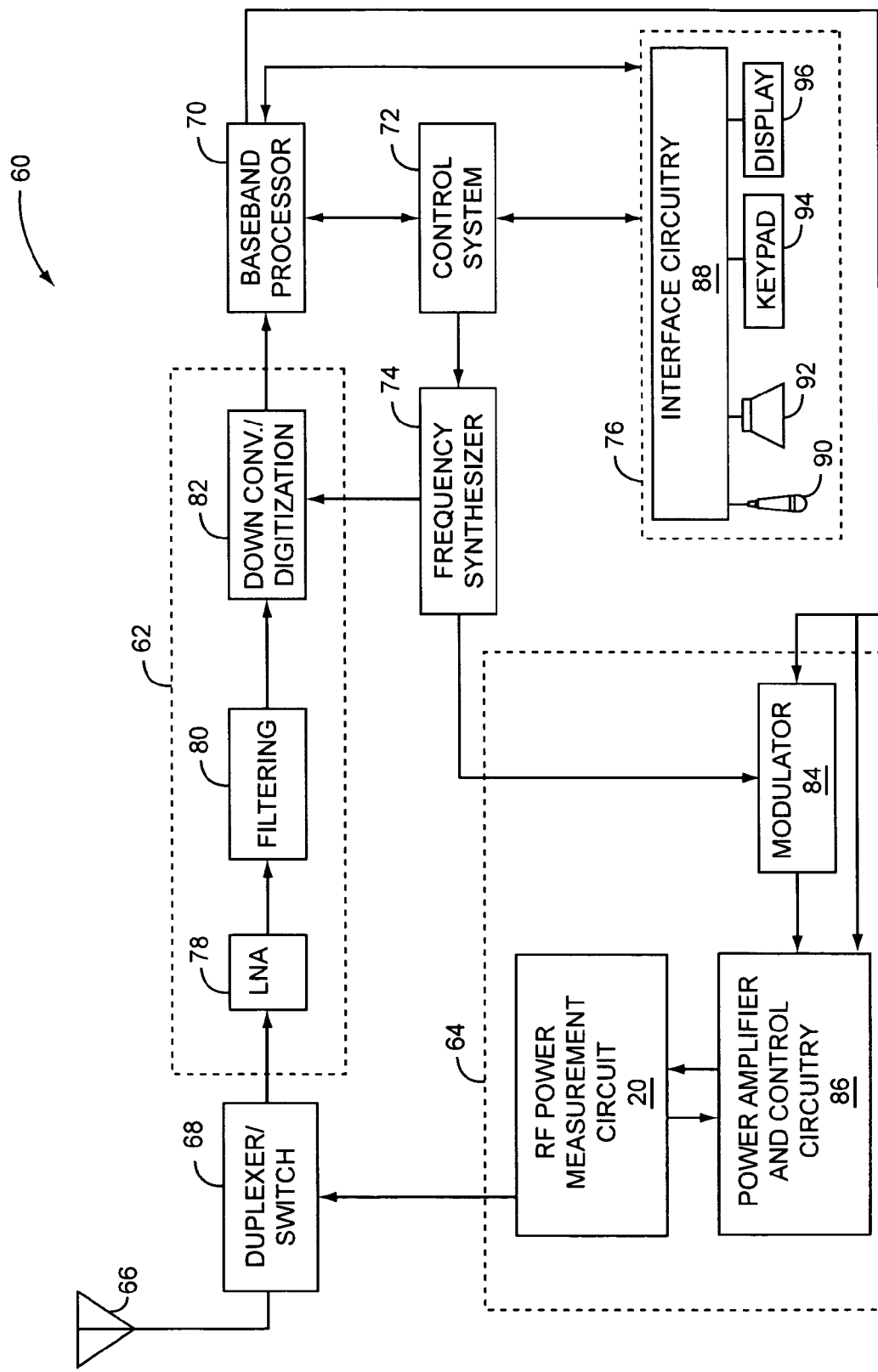

FIG. 13 shows an application example of the present invention used in a mobile terminal, according to one embodiment of the present invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to a radio frequency (RF) power measurement circuit that measures delivered power to a load. The RF power measurement circuit includes a measurement RF transmission line coupled to the load, and measurement and power calculation circuitry coupled to either end of the measurement RF transmission line to measure an RF input signal feeding the measurement RF transmission line and to measure an RF output signal fed from the measurement RF transmission line to the load. The measurement and power calculation circuitry uses the measured RF input and output signals to calculate and provide a delivered power signal that is indicative of the delivered power to the load.

The relationship between the RF input signal and the RF output signal varies with an electrical length of the measurement RF transmission line. Since the electrical length of the measurement RF transmission line varies with a frequency of the RF input and output signals, the frequency of the RF input and output signals may be determined and used to correct the delivered power signal to be substantially independent of frequency. Therefore, the RF power measurement circuit may accurately measure delivered power over a wide range of frequencies. In one embodiment of the present invention, the RF input and output signals are amplitude modulated (AM) signals traversing a modulation envelope. The measurement and power calculation circuitry may provide at least one delivered power signal based on instantaneous power, average power, instantaneous envelope power, peak envelope power, a ratio of peak envelope power to average power, or any combination thereof.

In some embodiments of the present invention, the RF power measurement circuit may be used as a stand-alone RF power meter, an in-line RF power meter, an integral RF power meter, a temporary RF power meter, an RF power meter used during manufacturing, testing, or servicing, the like, or any combination thereof. In one embodiment of the present invention, the RF power measurement circuit may be used to measure delivered power to an antenna in a communications system, which regulates the delivered power to the antenna to meet transmit power requirements of a particular communications standard, specific absorption ratio (SAR) requirements, or the like.

FIG. 4 shows an RF power measurement circuit 20 coupled between the RF signal source 10 and the load 12, according to one embodiment of the present invention. The RF power measurement circuit 20 includes a measurement RF transmission line 22 and measurement and power calculation circuitry 24. The RF signal source 10 feeds the load 12 through the RF transmission line 14 and the measurement RF transmission line 22. The RF signal source 10 provides the RF output signal $RF_{OUT}$ to the RF transmission line 14, which conveys the RF output signal $RF_{OUT}$ along a transmission line length to provide an RF power measurement input signal $RF_{PIN}$ to the measurement RF transmission line 22 and to the measurement and power calculation circuitry 24. The measurement RF transmission line 22 conveys the RF power measurement input signal $RF_{PIN}$ along a measurement transmission line length to provide an RF power measurement output signal $RF_{POUT}$ to the measurement and power calculation circuitry 24 and to provide the RF load signal $RF_{LD}$ to the load 12.

The measurement RF transmission line 22 has a characteristic impedance $Z_O$ and an electrical length $\theta m$. The RF power measurement input signal $RF_{PIN}$ provides an input voltage $V_A$ to the measurement and power calculation circuitry 24, and the RF power measurement output signal $RF_{POUT}$ provides an output voltage $V_B$ to the measurement and power calculation circuitry 24, which provides a first power signal $P_1$, which is indicative of the delivered power $P_D$ to the load 12, based on the input and output voltages $V_A$, $V_B$, the characteristic impedance $Z_O$, and the electrical length $\theta m$. The delivered power $P_D$ to the load 12 is based on the output voltage $V_B$ and a load current I.

The electrical length $\theta m$ of the measurement RF transmission line 22 is equal to a physical length L of the measurement RF transmission line 22 divided by a wavelength $\lambda$ of an RF signal traversing the measurement RF transmission line 22. The physical length L has a unit of distance, such as meters. The wavelength $\lambda$ has units of distance per cycle, such as meters per 360 degrees. Therefore, the electrical length θm has a unit of cycles, such as degrees or radians. The wavelength λ is equal to a propagation velocity $VEL_P$ of the RF signal traversing the measurement RF transmission line 22 divided by a frequency f of the RF signal traversing the measurement RF transmission line 22. The propagation velocity $VEL_P$ has units of length per time, such as meters per second, and is typically a fraction of the speed of light. The frequency f has units of cycles per time, such as cycles per second. Therefore, the electrical length θm=Lf/$VEL_p$. It is important to note that the electrical length θm is proportional to the frequency f.

Operation of the RF power measurement circuit 20 is now presented using complex circuit analysis, particularly phasor circuit analysis. Some basic circuit and mathematical relationships are presented below.

$$A \cos(a) \cdot B \cos(b) = (AB/2)[\cos(a+b) + \cos(a-b)]. \quad \text{EQ. 1}$$

$$e^{jx} = \cos(x) + j \sin(x). \quad \text{EQ. 2}$$

$$S = P + jQ = VI^*/2. \quad \text{EQ. 3}$$

$$I = A + jB. \quad \text{EQ. 4}$$

$$I^* = A - jB. \quad \text{EQ. 5}$$

$$P = \Re(S) = \Re(VI^*/2). \quad \text{EQ. 6}$$

EQ. 1 is a product/sum trigonometric relationship. EQ. 2 is Euler's formula. EQ. 3 is a complex power equation, where S is complex power, P is real power, Q is reactive power, V is voltage, which is a complex variable, I is current, which is a complex variable, and I* is the complex conjugate of I. EQ. 4 and EQ. 5 show the relationship between I and I*. EQ. 6 shows the equation for real power, where $\Re(S)$ is the real part of S. EQ. 1 through EQ. 6 are well known to those of ordinary skill in the art. The delivered power $P_D$ to the load 12 is shown in EQ. 7.

*EQ. 7:*

$$P_D = \frac{1}{2} \Re\{V_B I^*\}.$$

From classic transmission line theory, the voltage and current along a lossless transmission line can be written as a function of its length θ in electrical degrees, as shown in EQ. 8 and EQ. 9.

*EQ. 8:*

$$V(\theta) = V^+ e^{-j\theta} + V^- e^{j\theta},$$

*EQ. 9:*

$$I(\theta) = \frac{V^+}{Z_0} e^{-j\theta} - \frac{V^-}{Z_0} e^{j\theta},$$

where V⁺ is the incident wave voltage and V⁻ is the reflected wave voltage. The reflection coefficient Γ is defined by EQ. 10.

*EQ. 10:*

$$\Gamma = \frac{V^-}{V^+}.$$

EQ. 11 and EQ. 12 are obtained by substituting EQ. 10 into EQ. 8 and EQ. 9, respectively.

*EQ. 11:*

$$V(\theta) = V^+ [e^{-j\theta} + \Gamma e^{j\theta}].$$

*EQ. 12:*

$$I(\theta) = \frac{V^+}{Z_0} [e^{-j\theta} - \Gamma e^{j\theta}].$$

Given that θ is equal to 0 at the load 12, $V(0)=V_B$ and current I(0)=I. EQ. 13 and EQ. 14 are obtained by substituting $V_B$ and I into EQ. 11 and EQ. 12, respectively.

*EQ. 13:*

$$V_B = V^+ [1 + \Gamma].$$

*EQ. 14:*

$$I = \frac{V^+}{Z_0} [1 - \Gamma].$$

Given that θ is equal to θm at the opposite end of the measurement RF transmission line 22 from the load 12, $V(\theta m) = V_A$. EQ. 15 is obtained by substituting $V_A$ into EQ. 11.

$$V_A = V^+ [e^{-j\theta m} + \Gamma e^{j\theta m}]. \quad \text{EQ. 15}$$

EQ. 16 is obtained by solving EQ. 15 for V⁺.

*EQ. 16:*

$$V^+ = \frac{V_A}{[e^{-j\theta m} + \Gamma e^{j\theta m}]}.$$

EQ. 17 is obtained by substituting EQ. 16 into EQ. 14.

*EQ. 17:*

$$I = \frac{V_A}{Z_0 [e^{-j\theta m} + \Gamma e^{j\theta m}]} [1 - \Gamma].$$

EQ. 18 is obtained by substituting EQ. 17 into EQ. 7.

*EQ. 18:*

$$P_D = \frac{1}{2} \Re\left\{ V_B \left[ \frac{V_A}{Z_0 [e^{-j\theta m} + \Gamma e^{j\theta m}]} [1 - \Gamma] \right]^* \right\}.$$

EQ. 19 is obtained by manipulation of EQ. 18.

*EQ. 19:*

$$P_D = \frac{1}{2} \Re\left\{ \frac{V_B V_A^*}{Z_0^* [e^{j\theta m} + \Gamma^* e^{-j\theta m}]} [1 - \Gamma^*] \right\}.$$

EQ. 20 is obtained by substituting EQ. 2 (Euler's formula) into EQ. 19.

$$EQ.\ 20: \quad P_D = \frac{1}{2}\Re\left\{\frac{V_B V_A^*}{Z_0^*[(1+\Gamma^*)\cos\theta m + j(1-\Gamma^*)\sin\theta m]}[1-\Gamma^*]\right\}.$$

EQ. 21 is obtained by multiplying and dividing EQ. 20 by the imaginary unit j.

$$P_D = \frac{1}{2}\Re\left\{\frac{jV_B V_A^*}{Z_0^*[j(1+\Gamma^*)\cos\theta m - (1-\Gamma^*)\sin\theta m]}[1-\Gamma^*]\right\}. \quad EQ.\ 21$$

EQ. 22 is obtained by re-arranging and simplifying EQ. 21.

$$P_D = \frac{1}{2}\Re\left\{\frac{V_B V_A^* e^{-j\frac{\pi}{2}}}{Z_0^*\left[\sin\theta m - j\frac{1+\Gamma^*}{1-\Gamma^*}\cos\theta m\right]}\right\}. \quad EQ.\ 22$$

$V_A$ and $V_B$ are real signals as shown in EQ. 23 and EQ. 24.

$$V_A = |V_A|\cos(\omega t + \phi_A). \quad EQ.\ 23$$

$$V_B = |V_B|\cos(\omega t + \phi_B), \quad EQ.\ 24$$

where $\omega=2\pi f$ and f is the frequency of the input and output voltages $V_A$, $V_B$. EQ. 25 is obtained by substituting EQ. 23 and EQ. 24 into EQ. 22, and taking the real part.

$$P_D = \frac{|V_A|\cos(\omega t + \varphi_A) \times |V_B|\cos\left(\omega t + \varphi_B - \frac{\pi}{2}\right)}{2Z_0 \sin\theta m}. \quad EQ.\ 25$$

EQ. 26 is obtained by substituting EQ. 1 into EQ. 25.

$$P_D = \frac{|V_A||V_B|\left[\cos\left(2\omega t + \varphi_A + \varphi_B - \frac{\pi}{2}\right) + \cos\left(\varphi_A - \varphi_B + \frac{\pi}{2}\right)\right]}{4Z_0 \sin\theta m}. \quad EQ.\ 26$$

EQ. 26 represents the instantaneous power delivered to the load 12. In one embodiment of the present invention, the measurement and power calculation circuitry 24 provides the first power signal $P_1$ based on the calculations shown in EQ. 26; therefore, the first power signal $P_1$ is indicative of instantaneous power delivered to the load 12. EQ. 27 is obtained by filtering out the angular frequency ($2\omega t$) term of EQ. 26, thereby leaving only a DC term, which is indicative of average power delivered to the load 12.

$$P_D = \frac{|V_A||V_B|\cos\left(\varphi_A - \varphi_B + \frac{\pi}{2}\right)}{2Z_0 \sin\theta m}. \quad EQ.\ 27$$

$\theta m$ can be expressed as a function of frequency as shown in EQ. 28.

$$\theta m = \frac{\theta_0 \omega}{\omega_0}, \quad EQ.\ 28$$

where $\omega=2\pi f$ and f is the frequency of input and output voltages $V_A$, $V_B$, and $\theta_0$ is the electrical length in degrees of the measurement RF transmission line 22 at a reference angular frequency $\omega_0$, such that $\omega_o=2\pi f_o$ and $f_o$ is a frequency of a reference signal. EQ. 29 is obtained by substituting EQ. 28 into EQ. 27.

$$P_D = \frac{|V_A||V_B|\cos\left[\varphi_A - \varphi_B + \frac{\pi}{2}\right]}{2Z_0 \sin\left[\frac{\theta_0 \omega}{\omega_0}\right]}. \quad EQ.\ 29$$

In one embodiment of the present invention, the measurement and power calculation circuitry 24 provides the first power signal $P_1$ based on the calculations shown in EQ. 29; therefore, the first power signal $P_1$ is indicative of average power delivered to the load 12. In other embodiments of the present invention, the RF power measurement circuit 20 may be coupled directly to the RF signal source 10 or may be coupled between an upstream RF transmission line 14, which is fed from the RF signal source 10, and a downstream RF transmission line 14, which feeds the load 12. All or part of the RF transmission line 14 may be omitted and the RF power measurement circuit 20 may be coupled directly between the RF signal source 10 and the load 12.

An important aspect of the present invention is inclusion of a term that is proportional to the frequency f in the denominator, such as the angular frequency $\omega$ as shown in EQ. 29 or the electrical length $\theta m$ as shown in EQ. 27. Inclusion of this term removes a dependency of the first power signal $P_1$ on the physical length L of the measurement RF transmission line 22. Otherwise, the first power signal $P_1$ would be an accurate indicator of delivered power $P_D$ to the load 12 at only one frequency f, such as with an electrical length $\theta m$ of 90 degrees. Therefore, with the present invention, the first power signal $P_1$ may be accurate over a wide range of frequencies, which is useful for general use RF power meter applications, multi-mode radio applications using different frequency bands, or the like. In general, the relationship between the input and output voltages $V_A$, $V_B$ is based on the electrical length $\theta m$; therefore, the first power signal $P_1$ is based on the frequency f to compensate for the relationship between the input and output voltages $V_A$, $V_B$.

Since the first power signal $P_1$ is not dependent on the physical length L, a relatively short section of the measurement RF transmission line 22 may be used. In one embodiment of the present invention, the electrical length $\theta m$ is less than about 180 degrees. In another embodiment of the present invention, the electrical length $\theta m$ is less than about 90 degrees. In a first exemplary embodiment of the present invention, the electrical length $\theta m$ is equal to about 10 degrees. In a second exemplary embodiment of the present invention, the electrical length $\theta m$ is other than 90 degrees. By making the measurement RF transmission line 22 short, insertion loss may be minimized; however, phase differences between the input and output voltages $V_A$, $V_B$ may be reduced, thereby reducing resolution, accuracy, or both, of the first power signal $P_1$. Additionally, since part of the RF power measurement input and output signals $RF_{PIN}$, $RF_{POUT}$ are split to feed the measurement and power calculation circuitry 24, maximizing input impedances to the measurement and power calculation circuitry 24 may further minimize insertion loss.

In general, the portion of the RF power measurement input and output signals $RF_{PIN}$, $RF_{POUT}$ fed to the measurement and power calculation circuitry 24 may be as small as technology will allow. When compared with directional couplers and other RF power measurement techniques, the present invention may provide insertion losses that are quite low. In a first embodiment of the present invention, the insertion loss of the RF power measurement circuit 20 is less than about one decibel (db). In a second embodiment of the present invention, the insertion loss of the RF power measurement circuit 20 is less than about 0.1 db. In a third embodiment of the present invention, the insertion loss of the RF power measurement circuit 20 is less than about 0.01 db.

Since the present invention uses a section of RF transmission line as a sensing element, and since RF transmission lines may be small, inexpensive, and stable over a wide range of environmental conditions, the RF power measurement circuit 20 may be small, inexpensive, and stable over a wide range of environmental conditions. Additionally, since EQ. 27 and EQ. 29 can properly handle a wide range of incident wave voltages $V^+$ and reflected wave voltages $V^-$, and EQ. 27 and EQ. 29 are independent of the impedance of the load 12, the first power signal $P_1$ may be accurate regardless of the impedance of the load 12, impedance mismatch into the load 12, or both. Therefore, the RF power measurement circuit 20 may be useful for measuring delivered power into a load 12 having an arbitrary impedance, a changing impedance, or both. Additionally, the RF power measurement circuit 20 may not introduce significant series impedance when the measurement RF transmission line 22 is about matched to the load 12.

FIG. 5 shows details of the measurement and power calculation circuitry 24 illustrated in FIG. 4, according to one embodiment of the measurement and power calculation circuitry 24. The measurement and power calculation circuitry 24 includes buffering and scaling circuitry 26, phase-shifting circuitry 28, an RF four quadrant multiplier 30, and filtering and scaling circuitry 32. The buffering and scaling circuitry 26 receives, buffers, and scales the input and output voltages $V_A$, $V_B$ to provide scaled input and output voltages $V_{A1}$, $V_{B1}$ to the phase-shifting circuitry 28, which applies a 90 degree phase-shift to the scaled input and output voltages $V_{A1}$, $V_{B1}$ to provide phase-shifted input and output voltages $V_{A2}$, $V_{B2}$ to the RF four quadrant multiplier 30. The RF four quadrant multiplier 30 multiplies the phase-shifted input and output voltages $V_{A2}$, $V_{B2}$ to provide an instantaneous power signal $P_{INST}$.

In a first example of the present invention, the input and output voltages $V_A$, $V_B$ are given by EQ. 23 and EQ. 24 as repeated below.

$$V_A = |V_A|\cos(\omega t + \varphi_A), \quad \text{EQ. 23}$$

$$V_B = |V_B|\cos(\omega t + \varphi_B), \quad \text{EQ. 24}$$

where $\omega = 2\pi f$ and f is the frequency of the input and output voltages $V_A$, $V_B$. The buffering and scaling circuitry 26 applies a scaling factor SF, which is shown in EQ. 30, to the input and output voltages $V_A$, $V_B$ to provide the scaled input and output voltages $V_{A1}$, $V_{B1}$ as shown in EQ. 31 and EQ. 32, respectively. The scaling factor SF includes the electrical length $\theta m$, which is proportional to the frequency f; therefore, the buffering and scaling circuitry 26 must determine or be provided with the frequency f to determine the scaling factor SF.

$$SF = \frac{1}{\sqrt{2Z_0 \sin\theta m}}. \quad \text{EQ. 30}$$

$$V_{A1} = \frac{|V_A|\cos(\omega t + \varphi_A)}{\sqrt{2Z_0 \sin\theta m}}. \quad \text{EQ. 31}$$

$$V_{B1} = \frac{|V_B|\cos(\omega t + \varphi_B)}{\sqrt{2Z_0 \sin\theta m}}. \quad \text{EQ. 32}$$

The phase-shifting circuitry 28 applies a 90 degree ($-\pi/2$) phase-shift to the scaled output voltage $V_{B1}$ and no phase-shift to the scaled input voltage $V_{A1}$ to provide the phase-shifted input and output voltages $V_{A2}$, $V_{B2}$ as shown in EQ. 33 and EQ. 34.

$$V_{A2} = \frac{|V_A|\cos(\omega t + \varphi_A)}{\sqrt{2Z_0 \sin\theta m}}. \quad \text{EQ. 33}$$

$$V_{B2} = \frac{|V_B|\cos\left(\omega t + \varphi_B - \frac{\pi}{2}\right)}{\sqrt{2Z_0 \sin\theta m}}. \quad \text{EQ. 34}$$

The RF four quadrant multiplier 30 multiplies the phase-shifted input and output voltages $V_{A2}$, $V_{B2}$ to provide the instantaneous power signal $P_{INST}$ as shown in EQ. 35, which shows the instantaneous power signal $P_{INST}$ of EQ. 35 is equivalent to the instantaneous power delivered to the load 12 as shown in EQ. 25.

$$P_{INST} = \frac{|V_A|\cos(\omega t + \varphi_A) \times |V_B|\cos\left(\omega t + \varphi_B - \frac{\pi}{2}\right)}{2Z_0 \sin\theta m}. \quad \text{EQ. 35}$$

The filtering and scaling circuitry 32 receives, filters, and scales, if necessary, the instantaneous power signal $P_{INST}$ to provide the first power signal $P_1$. In the first example, the filtering and scaling circuitry 32 filters out the 2 $\omega t$ term to provide the first power signal $P_1$ as shown in EQ. 36, which shows the first power signal $P_1$ of EQ. 36 is equivalent to the average power delivered to the load 12 as shown in EQ. 27.

$$P_1 = \frac{|V_A||V_B|\cos\left(\varphi_A - \varphi_B + \frac{\pi}{2}\right)}{2Z_0 \sin\theta m}. \quad \text{EQ. 36}$$

Alternate embodiments of the present invention may divide scaling between the buffering and scaling circuitry 26 and the filtering and scaling circuitry 32, or may use the filtering and scaling circuitry 32 for all scaling. Scaling may be unequal between the input signal side and the output signal side. Additionally, the 90 degree phase-shift provided by the phase-shifting circuitry 28 may be applied only to the scaled input voltage $V_{A1}$, the scaled output voltage $V_{B1}$, or divided between the scaled input voltage $V_{A1}$ and the scaled output voltage $V_{B1}$.

Figure 6:
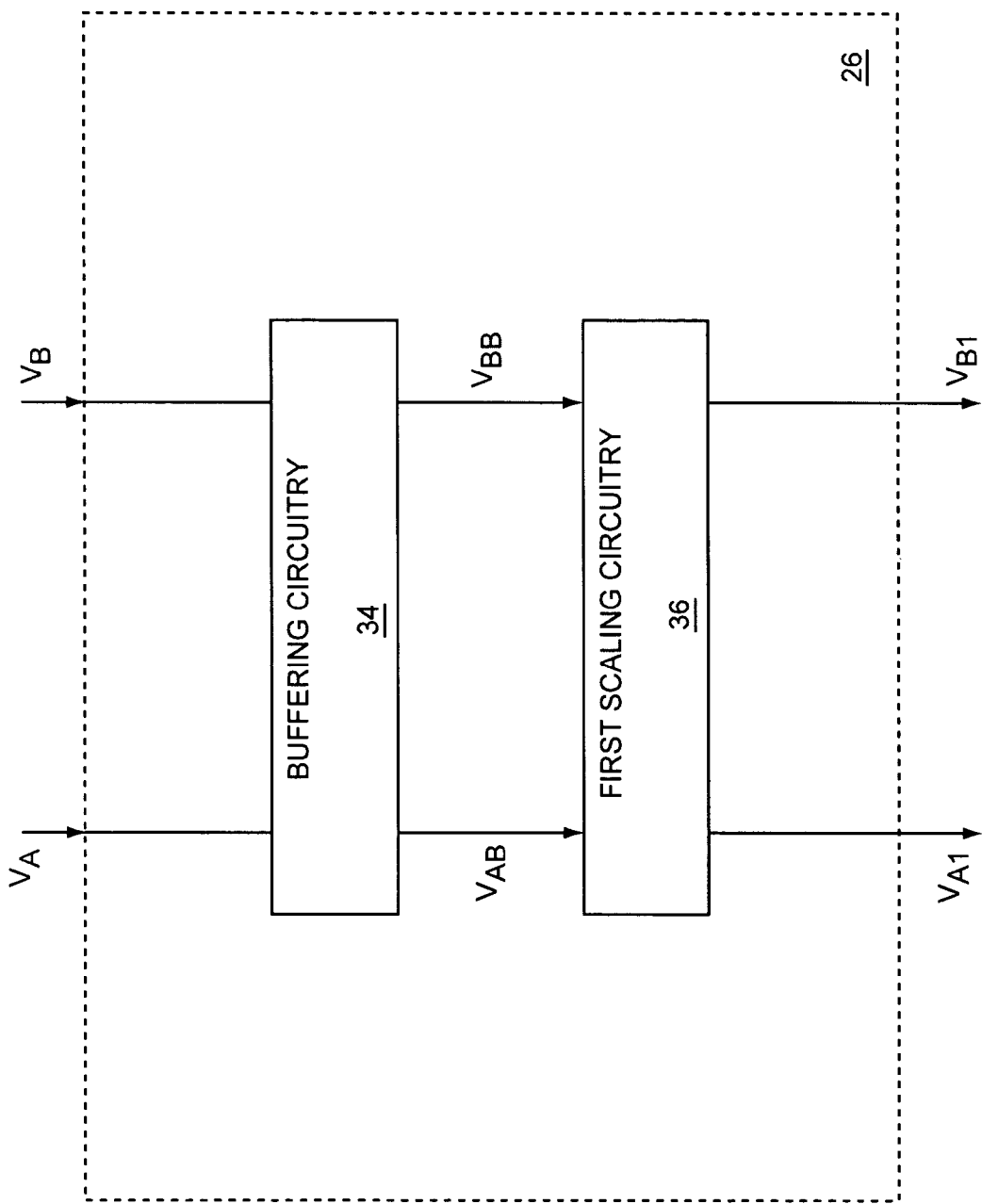
FIG. 6 shows details of buffering and scaling circuitry illustrated in FIG. 5.

FIG. 6 shows details of the buffering and scaling circuitry 26 illustrated in FIG. 5, according to one embodiment of the buffering and scaling circuitry 26. The buffering and scaling circuitry 26 includes buffering circuitry 34 and first scaling circuitry 36. The buffering circuitry 34 receives and buffers the input and output voltages $V_A$, $V_B$ to provide buffered input and output voltages $V_{AB}$, $V_{BB}$ to the first scaling circuitry 26, which applies a scaling factor SF to the buffered input and output voltages $V_{AB}$, $V_{BB}$ to provide the scaled input and output voltages $V_{A1}$, $V_{B1}$. The buffering circuitry 34 may present high impedances to the circuitry providing the input and output voltages $V_A$, $V_B$ to minimize insertion losses.

Figure 7:
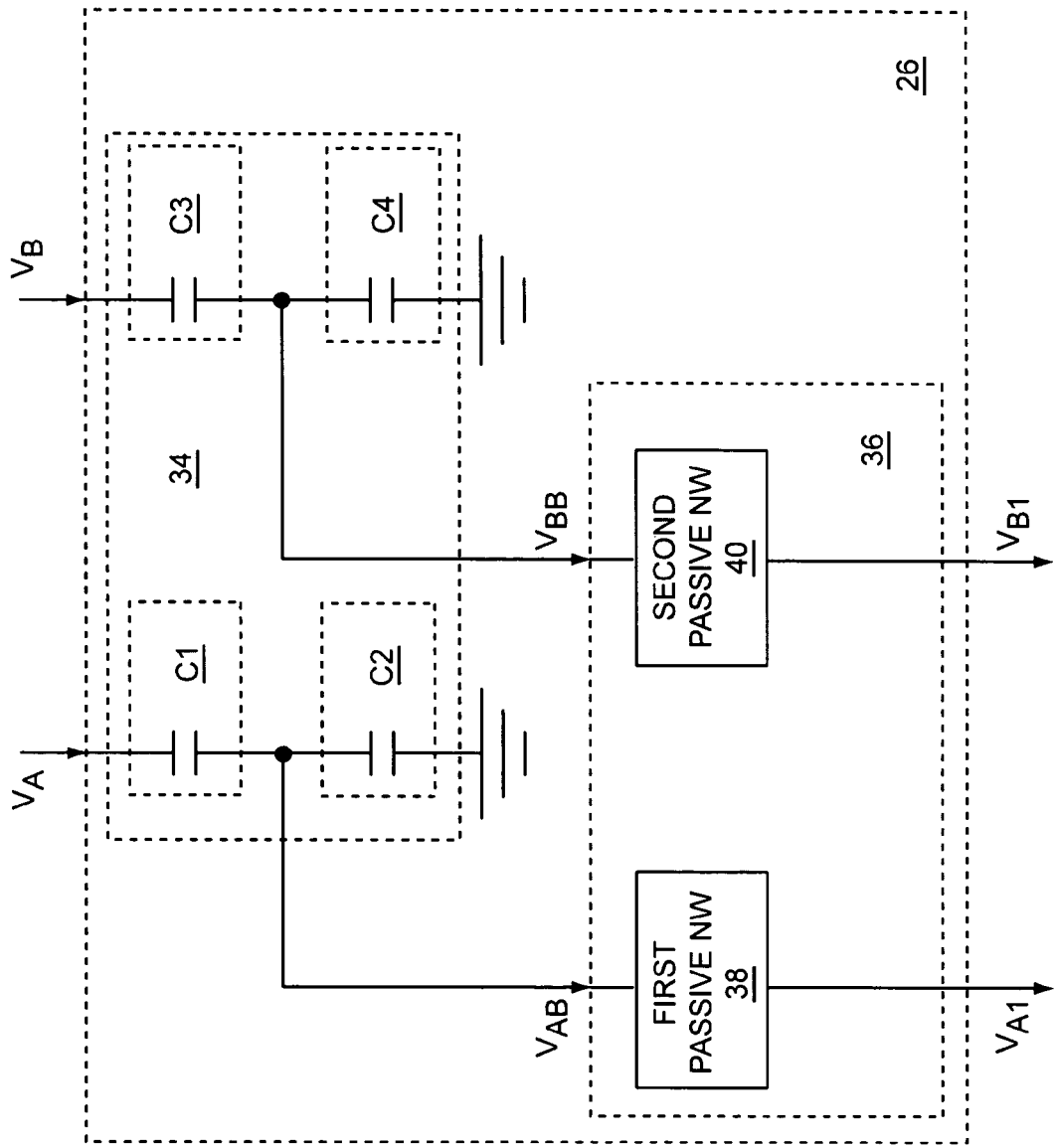
FIG. 7 shows details of buffering circuitry and first scaling circuitry illustrated in FIG. 6.

FIG. 7 shows details of the buffering circuitry 34 and the first scaling circuitry 36 illustrated in FIG. 6, according to one embodiment of the buffering circuitry 34 and the first scaling circuitry 36. The buffering circuitry 34 includes a first capacitive element C1 and a second capacitive element C2 configured as a voltage divider to receive and divide the input voltage $V_A$ to provide the buffered input voltage $V_{AB}$. Similarly, the buffering circuitry 34 includes a third capacitive element C3 and a fourth capacitive element C4 configured as a voltage divider to receive and divide the output voltage $V_B$ to provide the buffered output voltage $V_{BB}$. By using voltage dividers as buffers, the input and output voltages $V_A$, $V_B$ are attenuated by an attenuation factor K, which must be restored by the buffering and scaling circuitry 26, the filtering and scaling circuitry 32, or both. While the input and output voltages $V_A$, $V_B$ are attenuated by the attenuation factor K, the input impedances to the circuitry providing the input and output voltages $V_A$, $V_B$ may be increased by the attenuation factor K.

The first scaling circuitry 36 includes a first passive network 38 and a second passive network 40, according to one embodiment of the first scaling circuitry 36. The first passive network 38, which may be a filter with a particular frequency response, receives the buffered input voltage $V_{AB}$ and provides the scaled input voltage $V_{A1}$. The second passive network 40, which may be a filter with a particular frequency response, receives the buffered output voltage $V_{BB}$ and provides the scaled output voltage $V_{B1}$. The first and second passive networks 38, 40 may have the effect of multiplying the buffered input and output voltages $V_{AA}$, $V_{BB}$ by factors that are dependent on the frequencies of the buffered input and output voltages $V_{AB}$, $V_{BB}$, respectively. Therefore, the first and second passive networks 38, 40 receive and scale the buffered input and output voltages $V_{AB}$, $V_{BB}$ to provide the scaled input and output voltages $V_{A1}$, $V_{B1}$, respectively, using the scaling factor SF. The scaling factor SF is based on the frequency f of the input and output voltages $V_A$, $V_B$ and appropriate scaling, which may include all or part of the attenuation factor K. Alternate embodiments of the present invention may use alternate buffering methods, alternate scaling methods, alternate methods to provide frequency f information to the first scaling circuitry 36, or any combination thereof.

In a second example of the present invention, the input and output voltages $V_A$, $V_B$ are given by EQ. 23 and EQ. 24 as repeated below.

$$V_A = |V_A|\cos(\omega t + \varphi_A),$$ EQ. 23

$$V_B = |V_B|\cos(\omega t + \varphi_B),$$ EQ. 24 where $\omega = 2\pi f$ and f is the frequency of the input and output voltages $V_A$, $V_B$. The buffering and scaling circuitry 26 applies the attenuation factor K and the scaling factor SF, which is shown in EQ. 37, to the input and output voltages $V_A$, $V_B$ to provide the scaled input and output voltages $V_{A1}$, $V_{B1}$ as shown in EQ. 38 and EQ. 39. The scaling factor SF includes the electrical length $\theta m$, which is proportional to the frequency f of the input and output voltages $V_A$, $V_B$ $$SF = \frac{1}{\sqrt{\sin\theta m}}.$$ EQ. 37

$$V_{A1} = \frac{|V_A|\cos(\omega t + \varphi_A)}{K\sqrt{\sin\theta m}}.$$ EQ. 38

$$V_{B1} = \frac{|V_B|\cos(\omega t + \varphi_B)}{K\sqrt{\sin\theta m}}.$$ EQ. 39

The phase-shifting circuitry 28 applies a 90 degree ($-\pi/2$) phase-shift to the scaled output voltage $V_{B1}$ and no phase-shift to the scaled input voltage $V_{A1}$ to provide the phase-shifted input and output voltages $V_{A2}$, $V_{B2}$ as shown in EQ. 40 and EQ. 41.

$$V_{A2} = \frac{|V_A|\cos(\omega t + \varphi_A)}{K\sqrt{\sin\theta m}}.$$ EQ. 40

$$V_{B2} = \frac{|V_B|\cos\left(\omega t + \varphi_B - \frac{\pi}{2}\right)}{K\sqrt{\sin\theta m}}.$$ EQ. 41

The RF four quadrant multiplier 30 multiplies the phase-shifted input and output voltages $V_{A2}$, $V_{B2}$ to provide the instantaneous power signal $P_{INST}$ as shown in EQ. 42.

$$P_{INST} = \frac{|V_A|\cos(\omega t + \varphi_A) \times |V_B|\cos\left(\omega t + \varphi_B - \frac{\pi}{2}\right)}{K^2 \sin\theta m}.$$ EQ. 42

The filtering and scaling circuitry 32 receives, filters, and scales the instantaneous power signal $P_{INST}$ using a supplemental scaling factor SSF, which is shown in EQ. 43 to provide the first power signal $P_1$. In the second example, the filtering and scaling circuitry 32 filters out the $2\omega t$ term to provide the first power signal $P_1$ as shown in EQ. 44, which shows the first power signal $P_1$ of EQ. 44 is equivalent to the average power delivered to the load 12 as shown in EQ. 27.

$$SSF = K^2/2Z_o.$$ EQ. 43

$$P_1 = \frac{|V_A||V_B|\cos\left(\varphi_A - \varphi_B + \frac{\pi}{2}\right)}{2Z_0 \sin\theta m}.$$ EQ. 44

FIGS. 8A, 8B, and 8C show a first embodiment, a second embodiment, and a third embodiment, respectively, of the phase-shifting circuitry 28 illustrated in FIG. 5. In the first embodiment of the phase-shifting circuitry 28, the phase-shifting circuitry 28 includes first 45 degree phase-shifting circuitry 44 and second 45 degree phase-shifting circuitry 46. The first 45 degree phase-shifting circuitry 44 applies a 45 degree phase-shift to the scaled input voltage $V_{A1}$ to provide the phase-shifted input voltage $V_{A2}$. Similarly, the second 45 degree phase-shifting circuitry 46 applies a 45 degree phase-shift to the scaled output voltage $V_{B1}$ to provide the phase-shifted output voltage $V_{B2}$. Alternate embodiments of the present invention may use a different combination of phase-shifts between the input signal side and the output signal side.

In the second embodiment of the phase-shifting circuitry 28, the phase-shifting circuitry 28 includes 90 degree phase-shifting circuitry 48. The 90 degree phase-shifting circuitry 48 applies a 90 degree phase-shift to the scaled input voltage $V_{A1}$ and no phase-shift to the scaled output voltage $V_{B1}$ to provide the phase-shifted input and output voltages $V_{A2}, V_{B2}$. In the third embodiment of the phase-shifting circuitry 28, the phase-shifting circuitry 28 includes the 90 degree phase-shifting circuitry 48. The 90 degree phase-shifting circuitry 48 applies a 90 degree phase-shift to the scaled output voltage $V_{B1}$ and no phase-shift to the scaled input voltage $V_{A1}$ to provide the phase-shifted input and output voltages $V_{A2}, V_{B2}$.

FIG. 9 shows details of a first embodiment of the filtering and scaling circuitry 32 illustrated in FIG. 5. The filtering and scaling circuitry 32 includes a first low pass filter 50 and a third scaling amplifier 52. The first low pass filter 50 receives and filters the instantaneous power signal $P_{INST}$ to filter out the angular frequency (2 ωt) term of EQ. 26, thereby leaving only a direct current (DC) term, thereby providing a filtered power signal $P_{FILT}$, which is fed to the third scaling amplifier 52. The third scaling amplifier 52 applies the supplemental scaling factor SSF to the filtered power signal $P_{FILT}$ to provide the first power signal $P_1$. In an alternate embodiment of the filtering and scaling circuitry 32, the third scaling amplifier 52 is replaced with multiplication circuitry, which applies the supplemental scaling factor SSF to the filtered power signal $P_{FILT}$ to provide the first power signal $P_1$.

FIG. 10 is a graph illustrating an AM RF output signal $RF_{OUT}$, according to a second embodiment of the filtering and scaling circuitry 32. The AM RF output signal $RF_{OUT}$ has an RF envelope $RF_{ENV}$ that tracks the amplitude of the AM RF output signal $RF_{OUT}$. The RF envelope $RF_{ENV}$ has an envelope peak $RF_{PEAKEN}$ that corresponds with a peak envelope power delivered to the load 12.

FIG. 11 shows details of the measurement and power calculation circuitry 24 illustrated in FIG. 4, according to the second embodiment of the filtering and scaling circuitry 32. Instead of providing the first power signal $P_1$, the filtering and scaling circuitry 32 provides an average power signal $P_{AVE}$, which is indicative of average power delivered to the load 12, an instantaneous envelope power signal $P_{INSTENV}$, which is indicative of instantaneous envelope power delivered to the load 12, a peak envelope power signal $P_{PEAKENV}$, which is indicative of the peak envelope power delivered to the load 12, and a peak to average power signal $P_{PEAKTOAVE}$, which is indicative of a ratio of the peak envelope power delivered to the load 12 divided by the average power delivered to the load 12. Alternate embodiments of the filtering and scaling circuitry 32 may omit any of the average power signal $P_{AVE}$, the instantaneous envelope power signal $P_{INSTENV}$, the peak envelope power signal $P_{PEAKENV}$, and the peak to average power signal $P_{PEAKTOAVE}$.

FIG. 12 shows details of the second embodiment of the filtering and scaling circuitry 32 illustrated in FIG. 11. The filtering and scaling circuitry 32 includes the first low pass filter 50, the third scaling amplifier 52, a second low pass filter 54, a peak detector circuit 56, and a ratio circuit 58. The first low pass filter 50 receives and filters the instantaneous power signal $P_{INST}$ to filter out the angular frequency (2 ωt) term of EQ. 26, thereby leaving only a DC term providing the filtered power signal $P_{FILT}$. However, the first low pass filter 50 has a cut-off frequency such that the RF envelope $RF_{ENV}$ is not filtered out; therefore, the filtered power signal $P_{FILT}$ follows the RF envelope $RF_{ENV}$. The filtered power signal $P_{FILT}$ is fed to the third scaling amplifier 52, which applies the supplemental scaling factor SSF to the filtered power signal $P_{FILT}$ to provide the instantaneous envelope power signal $P_{INSTENV}$.

The instantaneous envelope power signal $P_{INSTENV}$ is fed to the second low pass filter 54 and the peak detector circuit 56. The second low pass filter 54 filters out the RF envelope $RF_{ENV}$ from the instantaneous envelope power signal $P_{IN-STENV}$ to provide the average power signal $P_{AVE}$. The peak detector circuit 56 detects the envelope peak $RF_{PEAKEN}$ in the instantaneous envelope power signal $P_{INSTENV}$ to provide the peak envelope power signal $P_{PEAKENV}$. The average power signal $P_{AVE}$ and the peak envelope power signal $P_{PEAKENV}$ are fed to the ratio circuit 58, which determines the ratio of the peak envelope power delivered to the load 12 divided by the average power delivered to the load 12 to provide the peak to average power signal $P_{PEAKTOAVE}$. Alternate embodiments of the filtering and scaling circuitry 32 may omit any or all of the third scaling amplifier 52, the second low pass filter 54, the peak detector circuit 56, and the ratio circuit 58.

An application example of an RF power measurement circuit 20 is in a mobile terminal 60, the basic architecture of which is represented in FIG. 13, according to one embodiment of the present invention. The mobile terminal 60 may include a receiver front end 62, a radio frequency transmitter section 64, an antenna 66, a duplexer or switch 68, a baseband processor 70, a control system 72, a frequency synthesizer 74, and an interface 76. The receiver front end 62 receives information bearing radio frequency signals from one or more remote transmitters provided by a base station (not shown). A low noise amplifier (LNA) 78 amplifies the signal. A filter circuit 80 minimizes broadband interference in the received signal, while down conversion and digitization circuitry 82 down converts the filtered, received signal to an intermediate or baseband frequency signal, which is then digitized into one or more digital streams. The receiver front end 62 typically uses one or more mixing frequencies generated by the frequency synthesizer 74. The baseband processor 70 processes the digitized received signal to extract the information or data bits conveyed in the received signal. This processing typically comprises demodulation, decoding, and error correction operations. As such, the baseband processor 70 is generally implemented in one or more digital signal processors (DSPs).

On the transmit side, the baseband processor 70 receives digitized data, which may represent voice, data, or control information, from the control system 72, which it encodes for transmission. The encoded data is output to the transmitter 64, where it is used by a modulator 84 to modulate a carrier signal that is at a desired transmit frequency. Power amplifier and control circuitry 86 amplifies the modulated carrier signal to a level appropriate for transmission, and delivers the amplified and modulated carrier signal to the antenna 66 through the RF power measurement circuit 20 and the duplexer or switch 68. The baseband processor 70 may provide transmit power setpoint information to the power amplifier and control circuitry 86, which receives delivered power information from the RF power measurement circuit 20. The power amplifier and control circuitry 86 regulates the delivered power to the duplexer or switch 68 based on the transmit power setpoint information and the power information.

A user may interact with the mobile terminal 60 via the interface 76, which may include interface circuitry 88 associated with a microphone 90, a speaker 92, a keypad 94, and a display 96. The interface circuitry 88 typically includes analog-to-digital converters, digital-to-analog converters, amplifiers, and the like. Additionally, it may include a voice encoder/decoder, in which case it may communicate directly with the baseband processor 70. The microphone 90 will typically convert audio input, such as the user's voice, into an electrical signal, which is then digitized and passed directly or indirectly to the baseband processor 70. Audio information encoded in the received signal is recovered by the baseband processor 70, and converted by the interface circuitry 88 into an analog signal suitable for driving the speaker 92. The keypad 94 and display 96 enable the user to interact with the mobile terminal 60, input numbers to be dialed, address book information, or the like, as well as monitor call progress information.

In one embodiment of the present invention, the mobile terminal 60 operates using two different frequency bands. During a first mode of operation, the power amplifier and control circuitry 86 transmits the amplified and modulated carrier signal at a first frequency in a first frequency band. During a second mode of operation, the power amplifier and control circuitry 86 transmits the amplified and modulated carrier signal at a second frequency in a second frequency band. The ratio of the first frequency to the second frequency may be greater than two to one.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

Those skilled in the art will recognize improvements and modifications to the preferred embodiments of the present invention. All such improvements and modifications are considered within the scope of the concepts disclosed herein and the claims that follow.

What is claimed is:

1. A radio frequency (RF) power measurement circuit comprising:
   an RF transmission line having a characteristic impedance and an electrical length between a first point and a second point; and
   circuitry coupled to the first point and the second point, and when a load is applied to the second point and an RF input signal is applied to the first point, the circuitry is adapted to:
     receive the RF input signal;
     receive an RF output signal from the second point; and
     when the RF input signal has a first frequency, provide a first signal, which is indicative of RF power delivered to the load and is based on the characteristic impedance, the first frequency, the RF input signal, and the RF output signal.

2. The RF power measurement circuit of claim 1 wherein the electrical length is other than 90 degrees.

3. The RF power measurement circuit of claim 1 wherein the electrical length is less than about 90 degrees.

4. The RF power measurement circuit of claim 3 wherein the electrical length is about 10 degrees.

5. The RF power measurement circuit of claim 1 wherein the electrical length is less than about 180 degrees.

6. The RF power measurement circuit of claim 1 wherein a relationship between the RF input signal and the RF output signal is based on the electrical length and the first signal is based on the first frequency to compensate for the relationship.

7. The RF power measurement circuit of claim 1 wherein when the RF input signal has a second frequency, such that the second frequency is at least two times the first frequency, the first signal is based on the characteristic impedance, the second frequency, the RF input signal, and the RF output signal.

8. The RF power measurement circuit of claim 1 wherein the first signal is further indicative of average RF power delivered to the load.

9. The RF power measurement circuit of claim 1 wherein the RF input signal is an amplitude modulated (AM) signal having an RF envelope, and the first signal is further indicative of peak envelope power delivered to the load.

10. The RF power measurement circuit of claim 1 wherein the RF input signal is an amplitude modulated (AM) signal having an RF envelope, and the first signal is further indicative of a ratio of peak envelope power delivered to the load divided by average RF power delivered to the load.

11. The RF power measurement circuit of claim 1 wherein the circuitry further comprises phase-shifting circuitry adapted to:
    receive the RF input signal and the RF output signal; and
    apply at least one phase-shift to at least one of the RF input signal and the RF output signal to provide a second signal and a third signal, such that:
      an amplitude of the second signal is about equal to an amplitude of the RF input signal;
      an amplitude of the third signal is about equal to an amplitude of the RF output signal;
      the second signal has about the first frequency;
      the third signal has about the first frequency;
      a phase difference between the RF input signal and the RF output signal is equal to a first phase difference;
      a phase difference between the second signal and the third signal is equal to a second phase difference; and
      a difference between the first phase difference and the second phase difference is equal to a third phase difference,
    wherein the first signal is further based on the second signal and the third signal.

12. The RF power measurement circuit of claim 11 wherein the third phase difference is equal to about 90 degrees.

13. The RF power measurement circuit of claim 11 wherein the circuitry further comprises an RF four quadrant multiplier adapted to:
    receive the second signal and the third signal; and
    multiply the second signal and the third signal to provide an RF four quadrant multiplier output signal,
    wherein the first signal is further based on the RF four quadrant multiplier output signal.

14. The RF power measurement circuit of claim 13 wherein the circuitry further comprises an RF filter adapted to:
    receive the RF four quadrant multiplier output signal; and
    filter the RF four quadrant multiplier output signal to provide a filtered RF four quadrant multiplier output signal,
    wherein the first signal is further based on the filtered RF four quadrant multiplier output signal.

15. The RF power measurement circuit of claim 1 wherein the circuitry further comprises buffering and scaling circuitry adapted to:
    receive the RF input signal and the RF output signal;
    provide a scaled RF input signal based on the RF input signal and a first scaling factor; and
    provide a scaled RF output signal based on the RF output signal and a second scaling factor,
    wherein the first signal is further based on the scaled RF input signal and the scaled RF output signal.

16. The RF power measurement circuit of claim 15 wherein:
    a magnitude of the scaled RF input signal is about equal to a magnitude of the RF input signal times the first scaling factor; and
    a magnitude of the scaled RF output signal is about equal to a magnitude of the RF output signal times the second scaling factor.

17. The RF power measurement circuit of claim 15 wherein the first scaling factor is based on the first frequency and the second scaling factor is based on the first frequency.

18. The RF power measurement circuit of claim 15 wherein the circuitry further comprises phase-shifting circuitry adapted to:
- receive the scaled RF input signal and the scaled RF output signal; and
- apply at least one phase-shift to at least one of the scaled RF input signal and the scaled RF output signal to provide a second signal and a third signal, such that:
  - an amplitude of the second signal is about equal to an amplitude of the scaled RF input signal;
  - an amplitude of the third signal is about equal to an amplitude of the scaled RF output signal;
  - the second signal has about the first frequency;
  - the third signal has about the first frequency;
  - a phase difference between the scaled RF input signal and the scaled RF output signal is equal to a first phase difference;
  - a phase difference between the second signal and the third signal is equal to a second phase difference; and
  - a difference between the first phase difference and the second phase difference is equal to a third phase difference, wherein the first signal is further based on the second signal and the third signal.

19. The RF power measurement circuit of claim 18 wherein the third phase difference is equal to about 90 degrees.

20. The RF power measurement circuit of claim 18 wherein the circuitry further comprises an RF four quadrant multiplier adapted to:
- receive the second signal and the third signal; and
- multiply the second signal and the third signal to provide an RF four quadrant multiplier output signal, wherein the first signal is further based on the RF four quadrant multiplier output signal.

21. The RF power measurement circuit of claim 1 further having an insertion loss wherein the insertion loss is less than about one decibel (db).

22. The RF power measurement circuit of claim 1 further having an insertion loss wherein the insertion loss is less than about 0.1 decibel (db).

23. The RF power measurement circuit of claim 1 further having an insertion loss wherein the insertion loss is less than about 0.01 decibel (db).

24. A method comprising:
- providing an RF transmission line having a characteristic impedance and an electrical length between a first point and a second point, and adapted to;
- when a load is applied to the second point and an RF input signal is applied to the first point, receiving and processing the RF input signal;
- receiving and processing an RF output signal from the second point; and
- when the RF input signal has a first frequency, providing a first signal, which is indicative of RF power delivered to the load and is based on the characteristic impedance, the first frequency, the processing the RF input signal, and the processing the RF output signal.

* * * * *